United States Patent
Corley et al.

(12) 
(10) Patent No.: US 6,608,161 B1
(45) Date of Patent: Aug. 19, 2003

(54) PROCESS FOR PRODUCING PHENOL-DICARBONYL CONDENSATES WITH INCREASED FLUORESCENCE, EPOXY RESINS, EPOXY RESIN SYSTEMS AND LAMINATES MADE WITH THE SAME

(75) Inventors: Larry Steven Corley, Houston, TX (US); Anthony Michael Pigneri, Houston, TX (US)

(73) Assignee: Resolution Performance Products LLC, Houston, TX (US)

( * ) Notice: Subject to any disclaimer, the term of this patent is extended or adjusted under 35 U.S.C. 154(b) by 0 days.

(21) Appl. No.: 09/518,506

(22) Filed: Mar. 3, 2000

Related U.S. Application Data
(60) Provisional application No. 60/120,247, filed on Feb. 16, 1999.

(51) Int. Cl.[7] .......................... C08G 8/04; C08G 59/08; C08H 61/06; B32B 27/38
(52) U.S. Cl. .................. 528/93; 442/131; 442/180; 525/481; 528/94; 528/98; 528/144; 528/165
(58) Field of Search ........................... 528/93, 98, 126, 528/144, 94, 165; 442/131, 180; 525/481

(56) References Cited

U.S. PATENT DOCUMENTS

| | | | | |
|---|---|---|---|---|
| 3,005,797 A | * | 10/1961 | Larkin et al. ........... | 528/144 X |
| 3,013,087 A | * | 12/1961 | Schwarzer ................ | 528/98 X |
| 3,738,862 A | * | 6/1973 | Klarquist et al. ......... | 528/93 X |
| 5,012,016 A | | 4/1991 | Li ............................. | 568/720 |
| 5,134,204 A | * | 7/1992 | Toriakai et al. ........... | 528/98 X |
| 5,304,624 A | * | 4/1994 | Koike et al. ................ | 528/98 |
| 5,508,328 A | * | 4/1996 | Olson ....................... | 528/93 X |
| 5,897,811 A | * | 4/1999 | Lesko ....................... | 528/98 X |
| 6,001,950 A | | 12/1999 | Gerber ...................... | 528/129 |

FOREIGN PATENT DOCUMENTS

EP    0571988 B1    1/1996

* cited by examiner

*Primary Examiner*—Richard D. Lovering

(57) ABSTRACT

The present invention provides a process for producing phenol-dicarbonyl condensates high in fluorescence by reacting a phenolic compound with a 1,2-dicarbonyl compound in the presence of a catalyst selected from one or more carboxylic acid(s) or one or more carboxylic acid precursor(s). The present invention further provides phenol-dicarbonyl condensates, epoxy resins, epoxy resin systems and laminates prepared using these phenol-dicarbonyl condensates.

26 Claims, 1 Drawing Sheet

PROCESS FOR PRODUCING PHENOL-DICARBONYL CONDENSATES WITH INCREASED FLUORESCENCE, EPOXY RESINS, EPOXY RESIN SYSTEMS AND LAMINATES MADE WITH THE SAME

This application claims the benefit of Provisional Application Ser. No. 60/120,247 filed Feb. 16, 1999.

FIELD OF THE INVENTION

The present invention relates to a process for producing phenol-dicarbonyl condensates of phenols with 1,2-dicarbonyl compounds which yields condensates that are very high in fluorescence and that can be glycidated with epihalohydrin and base to give epoxy resins which are also very high in fluorescence. The present invention further relates to the phenol-dicarbonyl condensates, epoxy resin systems and laminates made with the phenol-dicarbonyl condensates obtained and the phenol-dicarbonyl condensates of the present invention as curing agents in an epoxy resin system.

BACKGROUND OF THE INVENTION

Condensates of 1,2-dicarbonyl compounds with phenol compounds, especially the condensate of glyoxal with phenol (tetraphenolethane, TPE), are important intermediates for making specialty epoxy resins. Epoxy resins made from these materials are extensively used, especially in the electrical laminating industry, for increasing the glass transition temperature ($T_g$) of epoxy resin systems through their multifunctionality and particularly for facilitating printed wiring board inspection through their fluorescence. It is commercially desirable that these epoxy resins be high in fluorescence for maximum efficiency of use for printed wiring board inspection.

Prior art techniques for preparing these phenolic precondensates include the condensation of the phenol with the 1,2-dicarbonyl compound using a strong acid such as sulfuric or methanesulfonic acid, followed by neutralization of the acid with an aqueous solution of a material such as sodium hydroxide or sodium bicarbonate, extraction of the resultant salt with water, and isolation of the phenolic condensate product by evaporation of phenol and water from the organic layer. Alternative techniques include the use of a volatile strong acid such as hydrochloric acid, or an acid which decomposes to volatile materials at temperatures above 100° C. such as oxalic acid, as the catalyst. Use of these decomposable or volatile acids eliminates the need for neutralization or extraction before evaporation of the phenol. The above processes, however, tend to produce material of relatively low fluorescence.

SUMMARY OF THE INVENTION

It has now been found that when one or more carboxylic acid(s) or carboxylic acid precursor(s) are used as catalysts for the condensation reaction of phenolic compounds with 1,2-dicarbonyl compounds, phenol-dicarbonyl condensates with a high ratio of fluorescence to Gardner color are produced. These phenol-dicarbonyl condensates can be used to produce epoxy resins, epoxy resin systems, and laminates which are also high in fluorescence.

The present invention provides a process for producing phenol-dicarbonyl condensates high in fluorescence by reacting a phenolic compound with a 1,2-dicarbonyl compound in the presence of a catalyst selected from one or more carboxylic acid(s) or one or more carboxylic acid precursor(s). The present invention further provides phenol-dicarbonyl condensates, epoxy resins, epoxy resin systems and laminates prepared using these phenol-dicarbonyl condensates.

DETAILED DESCRIPTION OF THE INVENTION

Figure 1:
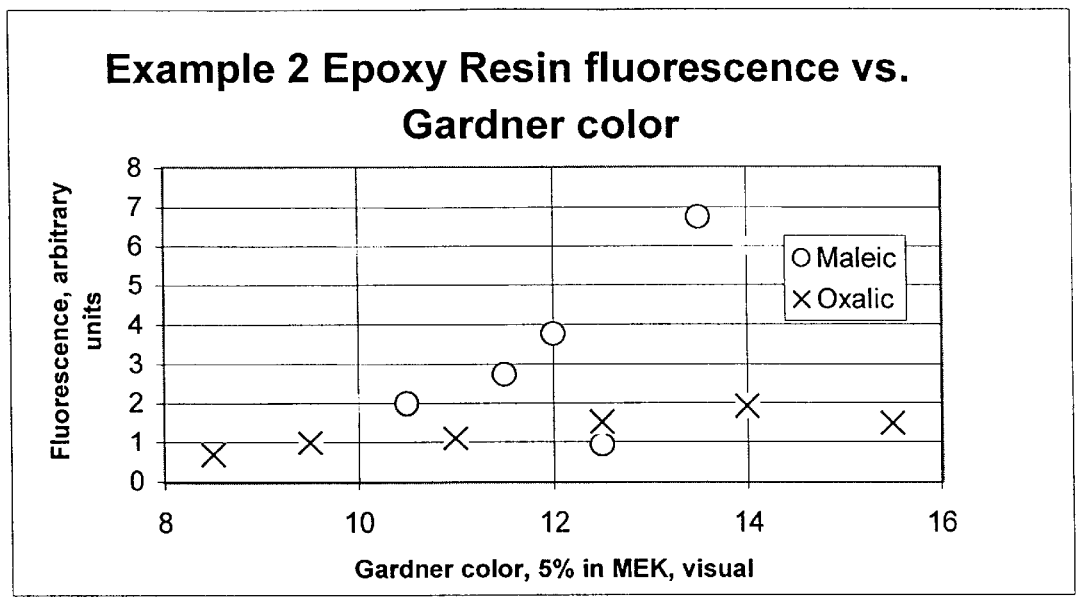
FIG. 1 depicts the results of fluorescence vs. Gardner color in an epoxy resin system made with maleic acid and a control system made with oxalic acid.

The process of the present invention provides for the production of condensation products having significant increases in fluorescence with only modest increases in Gardner color. In the process of the present invention, carboxylic acid(s) or carboxylic acid precursor(s) are used to catalyze the condensation reaction of phenolic compounds with 1,2-dicarbonyl compounds, thereby producing condensate products having high fluorescence. As used herein, the phrase "carboxylic acid precursors" refers to the acid anhydrides used to make the corresponding carboxylic acid (i.e., maleic anhydride is the precursor for maleic acid).

The starting materials for the condensation reaction are one or more 1,2-dicarbonyl compounds, one or more phenolic compounds and as a catalyst, one or more carboxylic acid(s) or carboxylic acid precursor(s).

In the present process, one or more carboxylic acid(s) or carboxylic acid precursor(s) are used to catalyze the reaction. The carboxylic acid precursor(s) are used to prepare the carboxylic acid(s) by subjecting the carboxylic acid precursor(s) to hydrolysis. The carboxylic acid(s) which may be used in the present invention include unsaturated dicarboxylic acids and aromatic acids having one or more hydroxyl groups attached to an aromatic carboxylic nucleus. Examples of these acids include, but are not limited to, maleic, fumaric and dihydroxyfumaric, acetylenedicarboxylic (ADCA), 2,6-dihydroxybenzoic (DHBA) and salicylic. Examples of the carboxylic acid precursor(s) which may be used include, but are not limited to, maleic anhydride, citraconic anhydride and chloromaleic anhydride. Maleic and acetylenedicarboxylic acids are particularly preferred because they produce very high-fluorescence phenol-dicarbonyl condensates with relatively low color at high yield of number of grams of condensate per kilogram of total batch. Because of their easy commercial availability and relatively low price, maleic acid and its precursor, maleic anhydride, are particularly preferred as catalysts.

Suitable 1,2-dicarbonyl compounds for use in the present process include compounds represented by the formula:

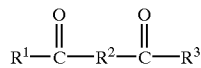

in which $R^1$ and $R^3$ are the same or different and are selected from hydrogen and unsubstituted and non-interfering substituted $C_1$–$C_{20}$ alkyl, $C_6$–$C_{20}$ aryl, $C_2$–$C_{12}$ alkenyl, $C_3$–$C_{10}$ cycloalkyl, $C_6$–$C_{20}$ aralkyl, and $C_6$–$C_{20}$ alkaryl and $R^2$ is a direct bond, unsubstituted and non-interfering $C_1$–$C_{10}$ alkylidene, or one to five vinylene units.

Preferably, $R^1$ and $R^3$ are the same or different and are selected from hydrogen, $C_1$–$C_{10}$ alkyl, $C_6$–$C_{10}$ aryl and $C_3$–$C_6$ cycloalkyl. $R^2$ is preferably selected from a direct bond, methylene and ethylidene with a direct bond being the most preferred. As used herein, the term "substituted" refers to any hydrocarbyl linking moiety which contains a functional group such as carboxyl, nitro, amino, hydroxy (e.g. hydroxyethyl), oxy, cyano, sulfonyl, and sulfinyl or one or more halogen atoms. The majority of the atoms, other than hydrogen, in hydrocarbyl linking moieties are carbon, with the heteroatoms (i.e., oxygen, nitrogen, sulfur) representing only a minority, 33% or less, of the total non-hydrogen atoms present. Preferably, the 1,2-dicarbonyl compound is selected from glyoxal, acetylacetone, phenylglyoxal, diacetyl, benzil and pyruvaldehyde.

Those of ordinary skill in the art recognize that any incompletely ring-substituted phenolic compound may be utilized in the present process. Suitable phenolic compounds can be represented by the formula:

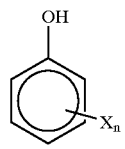

in which each X is a substituent which does not interfere with the condensation reaction with the dicarbonyl and n is an integer from 0 to 4. When n is from 1 to 4, each X is independently selected from halide, $C_1-C_{12}$ alkyl and substituted $C_1-C_{12}$ alkyl. As used herein, the term "substituted $C_1-C_{12}$ alkyl" refers to any $C_1-C_{12}$ alkyl which contains a functional group such as carboxyl, nitro, amino, hydroxyalkyl (e.g. hydroxyethyl), alkoxy, cyano, sulfonyl, and sulfinyl and one or more halogen atoms. The majority of the atoms, other than hydrogen, in substituted $C_1-C_{12}$ alkyl are carbon, with the heteroatoms (i.e., oxygen, nitrogen, sulfur) representing only a minority, 33% or less, of the total non-hydrogen atoms present. Preferably, X is selected from $C_1-C_{12}$ alkyl, more preferably $C_1-C_4$ alkyl. When X is $C_1-C_{12}$ alkyl, the alkyl may be linear or branched although preferably, the alkyl is branched.

When n is greater than 1, the X's may be taken together with the carbon atoms to which they are attached, to form one or more fused aromatic rings, such as naphthols, for example.

Preferred examples of phenolic compounds for preparation of the condensates of the present invention include phenol, o-cresol, m-cresol, p-cresol, 2,3-xylenol, 2,4-xylenol, 2,5-xylenol, 2,6-xylenol, 3,4-xylenol, 3,5-xylenol, 2,3,4-trimethylphenol, 2,3,5-trimethylphenol, 3,4,5-trimethylphenol, 1-naphthol, 2-naphthol and such, of which the preferred are phenol, o-cresol, m-cresol, p-cresol, 2,5-xylenol, 3,5-xylenol and 2,3,5-trimethylphenol, with phenol and o-cresol being the most preferred. The phenolic compounds may be used either singly or in combinations of two or more.

In the process of the present invention, the 1,2-dicarbonyl and phenolic compound are contacted in a reaction medium at a non-gelling ratio. Preferably, the ratio of moles of phenolic compound to moles of dicarbonyl is from 1.5:1 to 50:1, preferably from 3:1 to 20:1 and even more preferably from 3:1 to 10:1.

The amount of carboxylic acid or carboxylic acid precursor catalyst employed in the process of this invention can vary over a wide range, so long as a catalytic amount is present. In general, the catalyst is added to the reaction at a ratio of equivalents of acid or precursor to moles of phenolic compound from 0.001 to 0.50, preferably from 0.01 to 0.30, even more preferably from 0.02 to 0.20.

The process of the present invention may be carried out, for example, by placing all of the ingredients in a reaction vessel at one time and stirring while heating or by adding the ingredients gradually as the reaction proceeds while stirring and heating.

The reaction conditions employed in the process may also be varied over a wide range. Reaction time will generally depend upon the reaction temperature and other reaction conditions. The reaction temperature can be controlled suitably according to the reactivity of the reactants, and will generally range from 60° C. to 220° C., preferably from 100° C. to 190° C. although temperatures outside of this range are contemplated to be within the range of the present invention. The reaction pressure generally ranges from atmospheric to about 150 psig.

The reaction of the phenolic compound with the 1,2-dicarbonyl compound and catalyst may be conducted in the presence or absence of solvents or diluents. In many cases, the reactants will be liquids or low melting solids and the reaction may easily proceed without the addition of solvents or diluents. As the reaction proceeds, the reaction mixture may become viscous thereby making it necessary to add solvents or diluents. Solvents and diluents that are inert to the reaction may be used. Suitable solvents and diluents include, for example, 1-butanol, tetrahydrofuran, isopropyl alcohol, xylene, toluene, cyclohexane and the like. The solvent or diluent is preferably substantially free of any impurities.

As the mixture is heated, volatiles are allowed to distill at atmospheric pressure. Vacuum is then generally applied in order to distill excess phenolic compound. After complete devolatilization, the mixture is dispensed and allowed to cool.

The resulting high fluorescence phenol-dicarbonyl condensates can be used as intermediates for the production of epoxy resins which can be used to prepare fluorescent electrical laminates for printed wiring boards.

Fluorescent epoxy resins can be prepared from the phenol-dicarbonyl condensates by treating the phenol-dicarbonyl condensates obtained with epihalohydrin in the presence of a strong base such as sodium hydroxide or the like. The general process for glycidating phenolic compounds to produce epoxy resins is conventional and known in the art. See, for example, U.S. Pat. No. 2,658,885, incorporated herein by reference. The fluorescent epoxy resins of the present invention can be produced following this general process or any other conventional process.

For example, any epihalohydrin may be employed in the preparation of the epoxy resins of the present invention but epichlorohydrin is the most preferred epihalohydrin. The ratio of moles of epihalohydrin to equivalents of phenolic group in the phenol-dicarbonyl condensate during the glycidation reaction is typically from 1.5 to 30, preferably from 3 to 10.

As noted above, the strong base will preferably be sodium hydroxide although other strong bases may be used. The strong base is preferably added in an amount from 1.0 to 1.5 equivalents of base per equivalent of phenolic group.

The reaction of the epihalohydrin and condensate is usually conducted under relatively mild conditions of temperature and pressure. For example, the reaction can be conducted at from 20° C. to 120° C. at normal pressure. Depending on the solubility of the phenol-dicarbonyl condensate, the reaction is conducted in the absence or presence of conventional alcohol, ether, ketone or aromatic or aliphatic hydrocarbon solvents and the like. For example, the reaction is conducted at from 50° C. to 90° C. in one or more solvents such as diethyl ether, toluene, xylene, acetone, methyl isobutyl ketone, ethanol, water or especially, isopropanol. The resulting mixture is then devolatilized under vacuum before being dispensed.

The resulting highly fluorescent epoxy resin can be formulated into a resin system by curing the epoxy resin of the present invention with either dicyandiamide (cyanoguanidine or "DICY") or any phenolic curing agent or other curing agent for imparting optimum laminating properties to epoxy compositions (such as aliphatic amines, aromatic amines, acids, anhydrides, phenols, imidazoles and the like).

DICY is one preferred curing agent in the epoxy resin system of the present invention. When DICY is used as the curing agent, the amount employed is typically from 2 to 15 parts by weight per 100 parts by weight of epoxy resin, preferably 2 to 7 parts by weight per 100 parts by weight of epoxy resin.

When phenolic curing agents are used, they preferably have a phenolic functionality greater than about 1.75 phenol groups per molecule. One preferred group of phenolic curing agents is phenolic novolacs prepared by reacting a monohydroxy phenol such as phenol or o-cresol or a dihydroxy phenol such as resorcinol or bisphenol-A with formaldehyde in acid solution.

The Handbook of Epoxy Resins [by H. Lee and K. Neville, McGraw-Hill, New York (1967)], Epoxy Resins, Chemistry and Technology [edited by C. A. May, Marcel Dekker (1988)] and Chemistry and Technology of Epoxy Resins [edited by B. Ellis, Blackie Academic and Professional (1993)] contain various discussions concerning the curing of epoxy resins as well as compilations of curing agents.

The curing agent can also be a mixture of the phenolic resin curing agent and a brominated phenolic curing agent such as a brominated bisphenol-A. The brominated bisphenol-A will be present in an amount effective to increase flame retardancy, generally an amount up to 70 parts by weight per 100 parts by weight of epoxy resin, usually 30 to 60 parts by weight per 100 parts by weight epoxy resin.

When curing agents, other than DICY, are used, they will be present in the composition in an amount effective to cure the epoxy resin, which will generally be a stoichiometric amount of 0.75 to 1.25 equivalents per equivalent of epoxy resin. In terms of weight percent, the curing agent will be present in an amount generally from 10 to 200 parts by weight per 100 parts by weight of epoxy resin, preferably 15 to 100, more preferably 15 to 75.

In order to promote faster and/or lower temperature cure of the resin component of the epoxy resin system, an optional cure accelerator may be used. Many suitable accelerators, such as ureas, tertiary amines, imidazoles, phosphines, quaternary halides and alkali or alkaline earth metal hydroxides or carboxylates, for example, are known in the art. The presently preferred class is imidazoles such as 1-methyl imidazole, 2-ethyl imidazole, 2-methyl imidazole, 2-methyl-4-ethyl imidazole, 2-phenyl imidazole and isopropyl imidazole. Because of its availability and performance characteristics, 2-methyl imidazole is the preferred accelerator. The accelerator will be present in the composition in an amount effective to increase the cure rate and/or lower the cure temperature of the composition, generally in an amount from 0.01 to 7, preferably from 0.05 to 3 parts by weight per 100 parts by weight of epoxy resin.

The epoxy resin system of the present invention can optionally contain an organic solvent or diluent in an amount effective to decrease the viscosity of the system for ease of processing. Polar organic solvents such as ketones, alcohols and glycol ethers, for example, are suitable. The chosen solvent will generally have a boiling point less than 160° C. The preferred solvents include DMF, toluene and xylene, alcohols such as 2-methoxyethanol and 1-methoxy-2-propanol and ketones such as acetone, methyl ethyl ketone and methyl isobutyl ketone and solvent mixtures of these ketones with an alkylene glycol ether such as propylene glycol monomethyl ether. The proportion of solid components in the composition can vary widely depending upon the amount of the other constituents present and the intended application of the composition, but the solvent in the solvent-borne system will generally constitute from 15 to 50 weight percent of the total weight of the formulation.

In still another embodiment of the present invention, the phenol-dicarbonyl condensates of the present invention may be used as the phenolic curing agent in the resin system. When the phenol-dicarbonyl condensates of the present invention are used as phenolic curing agents, they may be used alone or as a mixture with other conventional curing agents such as DICY. They will also be used in the same amount and manner set forth hereinbefore for other phenolic curing agents.

When the phenol-dicarbonyl condensates of the present invention are used as the curing agent in a resin system, they may be used in combination with the epoxy resin of the present invention or with any conventional epoxy resin. Preferably, they will be used with conventional epoxy resins.

The epoxy resin component of the invention can be any epoxy-functional compound having an average of more than one vicinal epoxide group per molecule. Preferred epoxy resins are diglycidyl ethers of bisphenols such as bisphenol-A or bisphenol-F, prepared by the reaction of epichlorohydrin with these bisphenols carried out under alkaline reaction conditions. Such an epoxy resin can be represented by the structural formula:

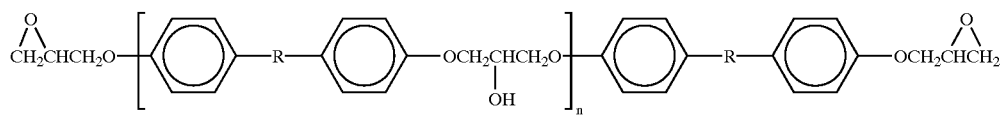

in which n is a number within the range of 0 to 2 and R is a direct bond or a divalent hydrocarbyl group. Suitable epoxy resins have molecular weights within the range of 300 to 3000, preferably about 300 to about 1000. The commercially available EPON® Resin 828, a reaction product of epichlorohydrin and bisphenol-A having an epoxide equivalent weight (ASTM D-1652) of about 187 and an n value in the formula above of about 0.2, is the preferred epoxy resin for use in the invention compositions.

Also suitable as the epoxy resin component are multi-functional glycidyl ethers of tetraphenol ethane, as represented by the following formula:

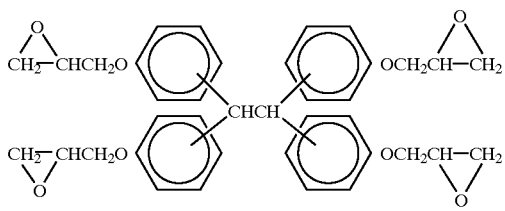

Such multi-functional epoxy resins are available commercially as EPON Resin 1031 from Shell Chemical Company. Other suitable resins can be prepared by the reaction of epichlorohydrin with mononuclear di- and trihydroxy phenolic compounds such as resorcinol and phloroglucinol, selected polynuclear polyhydroxyphenolic compounds such as bis(p-hydroxyphenyl)methane and 4,4'-dihydroxybiphenyl, or aliphatic polyols such as 1,4-butanediol and glycerol.

The epoxy resin component of the epoxy resin system can also include novolac-based epoxy resins ("novolac epoxy resins"), which are the glycidyl ethers of the product of reacting a phenol, such as phenol, cresol, resorcinol or bisphenol-A, with formaldehyde in acid solution.

Any brominated epoxy resin may also be used. The brominated epoxy resin component can be a polyglycidyl ether of (1) tetrabromobisphenol A or (2) a mixture of tetrabromobisphenol A and bisphenol A or (3) a mixture of tetrabromobisphenol A and polyhydroxy aromatic compound or (4) a mixture of tetrabromobisphenol A, a polyhydroxy aromatic compound and bisphenol A. Preferably, the brominated epoxy resin component has a functionality of from 2 to 8, a bromine content of from 10 to 50 percent by weight, preferably 18 to 22 percent by weight, and an epoxide equivalent weight of from 330 to 1500, preferably from 330 to 575. Suitable brominated epoxy resins include the fusion products of reacting a diglycidyl ether of 2,2-bis (4-hydroxyphenyl)propane (bisphenol-A) with tetrabromobisphenol A. The brominated epoxy resins preferably have an average weight per epoxide (WPE) greater than 350, preferably greater than 400 and number average molecular weight greater than about 700, preferably greater than about 800, and an epoxide functionality greater than about 1.5, preferably in the range of about 1.8 to about 2. Suitable commercial examples of such resins include EPON® Resin 1123, EPON® Resin 1120, EPON® Resin 1121, and EPON® Resin 1163.

In addition to the above-noted resin components being used individually in a resin system, combinations of the various resins may be used with the phenol-dicarbonyl condensate curing agents of the present invention.

If desired, the compositions of the present invention can also be blended with other materials such as fillers, dyes, flow modifiers, thickeners, anti-foamers, reinforcing agents, fire retarding or suppressing agents and combinations thereof. These additives are added in functionally equivalent amounts, e.g., the dyes are added in quantities which will provide the composition with the desired color. Suitably the amount of additives is from 0 to 200 percent by weight, especially from 20 to 100 percent, based on the combined weight of the epoxy resin and the curing agent. Each of the modifiers such as thickeners, flow modifiers and the like can be employed suitably in amounts of from 0.05 to 5, especially 0.1 to 3 percent by weight based on the combined weight of epoxy resin and curing agent. Reinforcing materials which can be employed herein include natural and synthetic fibers in the form of woven cloth, nonwoven mat, monofilament, chopped fibers and the like. Suitable reinforcing materials include glass, ceramics, nylon, rayon, cotton, aramid, graphite and combinations thereof. Suitable fillers which can be employed include, for instance, inorganic oxides, inorganic carbonates, ceramic microspheres, plastic microspheres, glass microspheres, clay, sand, gravel and combinations thereof. The fillers can be used in amounts suitable from 0 to 100, especially 10 to 60 percent by weight based upon the combined weight of epoxy resin and curing agent.

The epoxy resin systems of the present invention are used in preparing curable laminates according to standard procedures. A resin-containing solution with a curing agent and optional accelerator make up the "varnish" or laminating composition. In the initial stage of composites preparation, generally one or more substrates, glass, carbon, quartz, polyethylene, poly(p-phenyleneterephthalamide), polyester, polytetrafluoroethylene, poly(p-phenylenebenzobisthiazole), boron, paper or the like material, in chopped, mat or woven form, is impregnated with the varnish or a molten resin system. The composite is then exposed to temperature sufficient to evaporate any solvent present and partially cure without gelation (generally 40° C. to 200° C., preferably 150° C. to 190° C.) or exposed to IR radiation to partially cure without gelation, a process known as "B-staging". The composite is subjected to the B-staging treatment for a time sufficient to impart the desired degree of cure, generally 10 seconds to 8 minutes. The resulting product is generally referred to as a prepreg. The laminate is fabricated by subjecting a set of layered prepregs to conditions effective to cure the resin and to integrate the prepregs into a laminated sheet. The laminate can optionally contain one or more layers of conductive material. Laminating conditions generally include a time of 30 minutes to 4 hours, preferably 45 minutes to 90 minutes, a temperature of 160° C. to 225° C., preferably 170° C. to 200° C. and a pressure of 50 to 800 psi. The laminate can optionally be "post cured" by heating at a temperature of 140° C. to 225° C. at ambient pressure for 1 to 24 hours to improve thermal properties, preferably at a temperature of 170° C. to 200° C. for 1 to 6 hours.

The following examples are included to illustrate the present invention. It is understood that the examples are embodiments only and are given for the purpose of illustration and the invention is not to be regarded as limited to any specific components and/or specific conditions recited therein.

EXAMPLES

Example 1

Preparation of Tetraphenolethane (TPE) Using Different Acid Catalysts and Glycidation of the TPE to Epoxy Resin A 4-neck 1-liter round bottomed glass flask was fitted with a paddle stirrer, a distillation offtake, a polytetrafluoroethylene-coated thermocouple, and a heating mantle attached to a temperature controller. To the flask were added, in the quantities shown in Table 1, phenol (Shell Chemical), 40% aqueous glyoxal (BASF) and different acids as shown in Table 1. The temperature controller was set to 190° C. (or other temperature as shown in Table 1) and the reaction mixture was heated with stirring. Volatiles were allowed to distill at atmospheric pressure as the reaction mixture was heated. After the temperature reached the setpoint, it was kept at the setpoint for the number of hours specified in Table 1. Then the controller setpoint was raised to 190° C. (if it was not already at this point) and the system was heated to 190° C. with volatiles distilling at atmospheric pressure. After the reaction mixture reached 190° C., vacuum was applied. Excess phenol was allowed to distill under vacuum at 190° C. After distillation appeared to be complete, the TPE product was allowed to stand for approximately 15 minutes with stirring at 190° C. at full pump vacuum (pressure below approximately 100 Pa) in order to complete the devolatilization. The molten nonvolatile TPE product was then poured out of the flask into a steel can, allowed to solidify, broken up and weighed. Gardner color of the TPE was determined visually as a 5% solution in isopropyl alcohol. Fluorescence of the TPE was determined in tetrahydrofuran (THF) solution at 550 nm following excitation at 441 nm, against a common standard assigned an arbitrary value of 1.00.

For some lots of the TPE, each TPE sample (100 grams) was dissolved in a mixture of 337 grams epichlorohydrin, 168.7 grams isopropyl alcohol, 56.87 grams water, 14.51 grams isopropyl glycidyl ether and 2.89 grams. Subsequently, 195 grams of 20% aqueous NaOH solution were added to this mixture, with stirring, according to the following program:

At 65–70° C., start stirring and add 12.4% of NaOH charge, stir 8 minutes.

Add 14.6% of NaOH charge, stir 8 minutes.

Add 16.7% of NaOH charge, stir 8 minutes.

Add 18.8% of NaOH charge, stir 12 minutes.

Stop stirring, allow brine layer to settle, remove lower brine layer.

At 65–70° C., start stirring and add 6.2% of NaOH charge, stir 9 minutes.

Add 8.3% of NaOH charge, stir 9 minutes.

Add 10.4% of NaOH charge, stir 27 minutes.

Stop stirring, allow brine layer to settle, remove lower brine layer.

At 55–60° C., start stirring and add 8.3% of NaOH charge, stir 12 minutes.

Stop stirring, allow brine layer to settle, remove lower brine layer.

At 55–60° C., start stirring and add 4.3% of NaOH charge, stir 12 minutes.

Stop stirring, allow brine layer to settle, remove lower brine layer.

The organic phase was then washed three times with half its weight of water in order to remove inorganic salts. It was then heated to 155° C. to distill epichlorohydrin and other volatiles, with vacuum being applied after the distillation rate had become slow. Final devolatilization, after visible distillation had ceased, was carried out for approximately 15 minutes at 155° C. at full pump vacuum (pressure below approximately 100 Pa). The molten epoxy resin was then poured out of the flask into a steel can, allowed to solidify, broken up and weighed. Gardner color of the resin was determined visually by comparing to Gardner standards as a 5% solution in methyl ethyl ketone. Fluorescence of the epoxy resin was determined as for the TPE.

From Table 1, it can be seen that the TPE (and epoxy resin, where made) made using the invention acids as catalysts was generally considerably higher in fluorescence than that made using the control acids as catalysts. While the TPE made using formic acid at 120° C. was nearly as high in fluorescence as the TPE made using maleic acid at the same temperature, the formic acid process gave a tremendously lower yield of TPE (11% of charge versus 22%) at the same 120° C. reaction temperature even though the number of equivalents of acid catalyst used was higher. The Gardner color of the TPE produced with formic acid was also higher. The succinic acid process likewise gave a low TPE yield and high Gardner color. The high fluorescence of the TPE prepared by the invention process was largely carried over into the epoxy resin prepared from the TPE.

TABLE 1

|  | Experiment | | | | | | | |
| --- | --- | --- | --- | --- | --- | --- | --- | --- |
|  | 1 | 2 | 3 | 4 | 5 (control) | 6 (control) | 7 (control) | 8 (control) |
| TPE preparation: | | | | | | | | |
| Acid catalyst used (1) | Maleic | Maleic | ADCA (2) | DHBA (2) | Oxalic | Phthalic | Succinic | Formic |
| Acid or anhydride, g (eq acid) | 21.45 (0.437) | 21.45 (0.437) | 24.95 (0.437) | 33.70 (0.219) | 27.5 (0.438) | 32.4 (0.438) | 21.82 (0.436) | 27.59 (0.60) |
| Phenol, g (moles) | 564.6 (6) | 564.6 (6) | 564.6 (6) | 564.6 (6) | 564.6 (6) | 564.6 (6) | 564.6 (6) | 564.6 (6) |
| 40% aqueous glyoxal, g (moles) | 116.08 (0.8) | 116.08 (0.8) | 116.08 (0.8) | 116.08 (0.8) | 116.08 (0.8) | 116.08 (0.8) | 116.08 (0.8) | 116.08 (0.8) |
| Moles phenol/mole glyoxal | 7.5 | 7.5 | 7.5 | 7.5 | 7.5 | 7.5 | 7.5 | 7.5 |
| Equivalents acid/mole phenol | 0.073 | 0.073 | 0.073 | 0.036 | 0.073 | 0.073 | 0.073 | 0.100 |
| Reaction temperature setpoint, ° C. | 120 | 190 | 190 | 190 | 120 | 190 | 190 | 120 (3) |
| Time at set-point, hours | 2 | 2 | 2 | 2 | 2 | 2 | 2 | 2 |
| TPE product, g (% of charge) | 156.5 (22.3) | 162.6 (23.2) | 169.6 (24.0) | 134.5 (18.8) | 182.72 (25.8) | 141 (19.8) | 103.3 (14.7) | 80.4 (11.4) |
| Gardner color (5% in IPA) | 17 | 15 | 16 | >18 | 12.5 | 18 | >18 | >18 |

TABLE 1-continued

| | Experiment | | | | | | | |
|---|---|---|---|---|---|---|---|---|
| | 1 | 2 | 3 | 4 | 5 (control) | 6 (control) | 7 (control) | 8 (control) |
| Fluorescence | 3.24 | 5.11 | 6.01 | 5.11 | | 1.07 | 2.35 | 2.97 |
| Epoxy resin preparation: | | | | | | | | |
| WPE (grams/eq of epoxide group) | 220.4 | 234.1 | 213.4 | | 208.9 | | | |
| Gardner color (5% in methyl ethyl ketone) | 11.5 | 12 | 12.5 | | 11 | | | |
| Fluorescence, arbitrary units | 2.74 | 3.76 | | | 1.11 | | | |

(1) Maleic, phthalic and succinic acids were added as the corresponding anhydrides.
(2) ADCA=acetylenedicarboxylic acid; DHBA=2,6-dihydroxybenzoic acid
(3) Reaction conducted in a stainless steel autoclave under autogenous pressure in order to keep the volatile formic acid in the reaction mixture at the reaction temperature

Example 2

Relationship Between Gardner Color and Fluorescence for Epoxy Resin Made from TPE Made Under Different Reaction Conditions with Maleic Acid (from Maleic Anhydride) Versus Oxalic Acid (Control)

A 4-neck 1-liter round-bottomed glass flask was equipped as in Example 1 and charged with phenol, 40% aqueous glyoxal and maleic anhydride or oxalic acid in the quantities shown in Table 2. The temperature controller was set to 190° C. (or other temperature as shown in Table 2) and the reaction mixture was heated with stirring. Volatiles were allowed to distill at atmospheric pressure as the reaction mixture was heated. After the temperature reached the setpoint, it was kept at the setpoint for the number of hours specified in Table 2. Then the controller setpoint was raised to 190° C. (if it was not already at this point) and the system was allowed to heat to 190° C. with volatiles distilling at atmospheric pressure. After the reaction mixture reached 190° C., vacuum was applied and the TPE products were worked up and characterized as in Example 1. They were then made into epoxy resins by the same procedure used in Example 1 and the epoxy resins were characterized similarly. Results are shown in Table 2 and FIG. 1.

As shown in FIG. 1, for both the control resins produced from TPE made with oxalic acid and the invention resins made from TPE made with maleic acid, the points tend to fall along a curve in a plot of fluorescence versus Gardner color. However, fluorescence increased with increasing Gardner color at a much faster rate (steeper curve) for the resins made from TPE made with maleic acid than for the resins made from TPE made with oxalic acid. The only exception to this relationship was a point representing resin from TPE made with a very low amount of maleic acid, which fell roughly on the oxalic curve. Increasing fluorescence without excessive increase in Gardner color is highly desirable commercially, because the production of excessively dark electrical laminates (undesired by customers) can be avoided. FIG. 1 shows the superiority of the invention process for increasing fluorescence over the prior art techniques of, for example, simply lowering the ratio of phenol to glyoxal in the TPE process while using the same oxalic acid catalyst.

TABLE 2a

| | Experiment | | | | |
|---|---|---|---|---|---|
| | 1 | 2 | 3 | 4 | 5 |
| TPE preparation: | | | | | |
| Acid catalyst used (1) | Maleic | Maleic | Maleic | Maleic | Maleic |
| Acid or anhydride, g (eq acid) | 5.36 (0.109) | 21.45 (0.437) | 21.45 (0.437) | 21.45 (0.437) | 34.32 (0.7) |
| Phenol, g (moles) | 564.6 (6) | 564.6 (6) | 564.6 (6) | 564.6 (6) | 451.68 (4.8) |
| 40% aqueous glyoxal, g (moles) | 116.08 (0.8) | 116.08 (0.8) | 116.08 (0.8) | 116.08 (0.8) | 185.73 (1.28) |
| Moles phenol/mole glyoxal | 7.5 | 7.5 | 7.5 | 7.5 | 3.75 |
| Equivalents acid/mole phenol | 0.018 | 0.073 | 0.073 | 0.073 | 0.146 |
| Reaction temperature setpoint, ° C. | 190 | 190 | 100 | 190 | 190 |
| Time at setpoint, hours | 2 | 2 | 2 | 2 | 2 |
| TPE product, g (% | 140.6 | 106.7 | 156.5 | 162.6 | 260 |

TABLE 2a-continued

| | Experiment | | | | |
|---|---|---|---|---|---|
| | 1 | 2 | 3 | 4 | 5 |
| of charge) | (20.5) | (16.2) | (22.3) | (23.2) | (38.7) |
| Gardner color (5% in IPA) | 17 | 13 | 17 | 15 | 16.5 |
| Fluorescence | 1.35 | 2.53 | 3.24 | 5.11 | 8.22 |
| Epoxy resin preparation: | | | | | |
| WPE (grams/eq of epoxide group) | | 224.8 | 220.4 | 234.1 | 227.0 |
| Gardner color (5% in methyl ethyl ketone) | 12.5 | 10.5 | 11.5 | 12 | 13.5 |
| Fluorescence, arbitrary units | 0.94 | 2 | 2.74 | 3.76 | 6.75 |
| Absorptivity, L/g-cm, 441 nm, THF soln | 0.212 | 0.297 | 0.305 | 0.39 | 0.591 |
| Absorptivity, L/g-cm, 365 nm, THF soln | 1.76 | 3.16 | 3.17 | 3.48 | 5.44 |

TABLE 2b

| | Experiment | | | | | |
|---|---|---|---|---|---|---|
| | 6 | 7 | 8 | 9 | 10 | 11 |
| TPE preparation: | | | | | | |
| Acid catalyst used (1) | Oxalic | Oxalic | Oxalic | Oxalic | Oxalic | Oxalic |
| Acid or anhydride, g (eq acid) | 55.18 (0.875) | 55.18 (0.875) | 27.59 (0.438) | 24.52 (0.389) | 24.52 (0.389) | 12.26 (0.194) |
| Phenol, g (moles) | 1129.2 (12) | 1129.2 (12) | 564.6 (6) | 564.6 (6) | 564.6 (6) | 564.6 (6) |
| 40% aqueous glyoxal, g (moles) | 116.08 (0.8) | 1741.12 (1.2) | 116.08 (0.8) | 232.16 (1.6) | 232.16 (1.6) | 232.16 (1.6) |
| Moles phenol/mole glyoxal | 15 | 10 | 7.5 | 3.75 | 3.75 | 3.75 |
| Equivalents acid/mole phenol | 0.073 | 0.073 | 0.073 | 0.065 | 0.065 | 0.032 |
| Reaction temperature setpoint, °C. | 120 | 120 | 120 | 120 | 120 | 120 |
| Time at setpoint, hours | 6 | 6 | 6.5 | 2.5 | 4 | 4 |
| TPE product, g (% of charge) | 190.8 (14.7) | 286.6 (21.1) | 182.72 (25.8) | 313.87 (38.2) | 312.53 (38.1) | 254.74 (31.5) |
| Gardner color (5% in IPA) | 10 | 11.5 | 12.5 | 18 | 18 | 18 |
| Epoxy resin preparation: | | | | | | |
| WPE (grams/eq of epoxide group) | 203.2 | 205.9 | 208.9 | 222.1 | 221.4 | 210 |
| Gardner color (5% in methyl ethyl ketone) | 8.5 | 9.5 | 11 | 12.5 | 14 | 15.5 |
| Fluorescence, arbitrary units | 0.68 | 0.99 | 1.11 | 1.52 | 1.92 | 1.49 |
| Absorptivity, L/g-cm, 441 nm, THF soln | 0.108 | 0.176 | 0.226 | 0.464 | 0.413 | 0.48 |
| Absorptivity, L/g-cm, 365 nm, THF soln | 1.9 | 2.48 | 3.42 | 4.31 | 4.1 | 3.8 |

Example 3

Relationship of Reaction Conditions to Yield, Gardner Color and Fluorescence for TPE Made with Maleic Acid (From Maleic Anhydride)

A 4-neck 1-liter round bottomed glass flask was equipped as in Example 1 and charged with 451.68 grams of phenol, 185.73 grams of 40% aqueous glyoxal, and maleic anhydride in the quantities shown in Table 3. The temperature controller was set to 190° C. (or other temperature as shown in Table 3) and the reaction mixture was heated with stirring. Volatiles were allowed to distill at atmospheric pressure as the reaction mixture was heated. After the temperature reached the setpoint, it was kept at the setpoint for the number of hours specified in Table 3. Vacuum was then applied to distill excess phenol and the TPE products were worked up and characterized as in Example 1. Data are shown in Table 3. "Yield" in Table 3 is the weight of the TPE product as a percentage of the weight of the total reactor charge. "Color" is Gardner color as in Example 1; fluorescence was determined as in Example 1. As shown in Table 3, at a constant 190° C. reaction dwell time (before phenol vacuum distillation) of two hours, TPE fluorescence first increased with increasing maleic anhydride level in the charge to a peak at approximately 3.85% of charge. Fluorescence then decreased with further increases in maleic anhydride level in the charge. At a maleic anhydride level of 5.11% of the charge, fluorescence dropped sharply (in two experiments) as the 190° C. reaction dwell time was lengthened from zero to one hour. Fluorescence then increased dramatically as the 190° C. reaction dwell time was further increased to 2 hours. Extending the 190° C. reaction dwell time further to 5 hours caused little change in fluorescence at a maleic anhydride charge level of 2.62 weight percent and caused a moderate decrease in fluorescence at higher maleic anhydride charge levels. At a maleic anhydride charge level of 5.11%, reducing the 2-hour initial hold temperature from 190° C. to 175° C. also caused fluorescence to drop moderately. The variations in charge and reaction conditions shown in Table 3 apparently had only modest effects on yield and generally had very little effect on Gardner color.

a vendor), was also used. These were combined with a solution of 80 parts of EPON Resin 1124 (a brominated epoxy resin containing tetrabromobisphenol A and bisphenol A units) in 20 parts of acetone (solution designation EPON Resin 1124-A-80) and solutions of 7.69 parts dicyandiamide (cyanoguanidine, dicy) in 92.31 parts of 2-methoxyethanol and 10 parts of 2-methylimidazole in 90 parts of 2-methoxyethanol. The solutions were mixed into "varnishes" whose gel times were determined on a gel plate at 171° C. Squares of fiberglass cloth, 152 mm×152 mm, were coated with each varnish and were hung in a 163° C. oven for 4 minutes to remove solvent and partially react, or B-stage, the resin mixtures to form a prepreg. Gel time of the B-staged prepreg resin was also determined on a gel plate at 171° C. Eight sheets of each type of prepreg were then placed in a press under a pressure of 689 kPa and heated at 5.6° C./minute until a temperature of 177° C. was reached. The press was held at this temperature for one hour, cooled to 38° C. at a cooling rate of 13.9° C./minute, and then held at 38° C. for 5 minutes. The cured laminates were then removed from the press and analyzed for fluorescence. Results are shown in Table 4.

It can be seen from Table 4 that two of the laminates prepared with high-fluorescence TPE as the fluorescent component showed similar fluorescence to the control laminate prepared with standard-fluorescence EPON Resin 1031, although much lower fractions of the high-fluorescence TPE were used in the formulations. This shows that the enhanced solution fluorescence of the invention products translates to lower required use levels in actual laminated boards in order to get a given degree of fluorescence from the boards.

TABLE 4

| Fluorescent component | EPON Resin 1031 (commercial control) | TPE | TPE | TPE |
| --- | --- | --- | --- | --- |
| TPE preparation # from Table 2a | | 3 | 4 | 5 |
| Relative fluorescence of fluorescent | 1.0 | 3.24 | 5.11 | 8.22 |

TABLE 3

| Time at 190° C., hr. | Maleic anhydride, grams (weight % of charge) | 17.16 (2.62%) | 25.5 (3.85%) | 34.32 (5.11%) | 68.64 (9.72%) |
| --- | --- | --- | --- | --- | --- |
| 0 | Yield/color/fluorescence | | 34.9/18/4.94 | 36.2/18/5.49 36.3/18/5.94 | 37.7/17/4.73 |
| 1 | Yield/color/fluorescence | | 36.3/18+/7.09 | 37.9/15.8/1.11, 37.6/17.8/1.53 | 40.0/17/3.83 |
| 2 | Yield/color/fluorescence | 35.4/18/7.11, 35.2/18+/7.75 | 37.5/17.8/10.9, 37.4/18/7.07 | 38.6/17.5/7.04, 38.9/17.8/8.06 | 40.9/17.0/3.51 |
| 2 (175° C.) | Yield/color/fluorescence | | | 39.2/17.5/5.6 | |
| 5 | Yield/color/fluorescence | 35.8/18.0/7.58 | 37.2/17.8/7.52 | 39.9/17.8/6.56 | 43.9/17.5/3.24 |

Example 4

Preparation of Laminates Using High-fluorescence TPE and Fluorescence Determination of Laminates Solutions of some of the TPE products of Examples 1 and 2 were prepared by dissolving the materials in acetone. A corresponding acetone solution of EPON® Resin 1031 (a multifunctional epoxy resin produced by epichlorohydrin glycidation of "prior art" TPE commercially obtained from TABLE 4-continued

| Fluorescent component | EPON Resin 1031 (commercial control) | TPE | TPE | TPE |
| --- | --- | --- | --- | --- |
| component (1) | | | | |
| Formulation (parts): | | | | |

TABLE 4-continued

| Fluorescent component | EPON Resin 1031 (commercial control) | TPE | TPE | TPE |
|---|---|---|---|---|
| (2) | | | | |
| EPON Resin 1124 | 90.9 | 93.8 | 96.0 | 97.5 |
| TPE or EPON Resin 1031 | 9.1 | 6.2 | 4.0 | 2.5 |
| Dicyandiamide (dicy) | 2.8 | 2.8 | 2.8 | 2.8 |
| 2-Methylimidazole | 0.07 | 0.07 | 0.07 | 0.07 |
| Processing: | | | | |
| 171° C. varnish gel time, sec. | 150 | 165 | 210 | 190 |
| 171° C. prepreg gel time, sec. | 90 | 81 | 120 | 135 |
| B-staging time, 163° C., min. | 5 | 4 | 5 | 5 |
| Flow, 177° C. press cure | Similar | Similar | Similar | Similar |
| Cured properties: | | | | |
| Fluorescence index (1) | 1.0 | 0.88 | 1.0 | 1.0 |
| Color | Yellow | Darkest | Darker | Dark |
| Tg, ° C. (DSC) | 136 | 131 | 132 | 131 |

(1) Fluorescence was determined in tetrahydrofuran (THF) solution for the EPON® Resin 1031 or TPE, and directly as the solid for the cured laminate, at 550 nm following excitation at 441 nm, against a common standard assigned an arbitrary value of 1.00.

(2) All components were mixed as solutions in various solvents as described in the text of the example.

What is claimed is:

1. A process for producing phenol-dicarbonyl condensates high in fluorescence, said process comprising reacting one or more phenolic compounds with one or more 1,2-dicarbonyl compounds in the presence of one or more carboxylic acid(s) catalysts or one or more carboxylic acid precursor(s) catalysts comprising maleic acid, fumaric acid, dihydroxyfumaric acid, acetylenedicarboxylic acid, 2,6-dihydroxybenzoic acid, salicylic acid, maleic anhydride, citraconic anhydride or chloromaleic anhydride.

2. The process of claim 1 wherein the one or more carboxylic acid(s) are selected from the group consisting of maleic, fumaric, dihydroxyfumaric, acetylenedicarboxylic, 2,6-dihydroxybenzoic and salicylic acids.

3. The process of claim 1 wherein the one or more carboxylic acid precursor(s) are selected from the group consisting of maleic anhydride, citraconic anhydride and chloromaleic anhydride.

4. The process of claim 1 wherein the catalyst is selected from the group consisting of maleic acid and maleic anhydride.

5. The process of claim 1 wherein the phenolic compounds are represented by the formula:

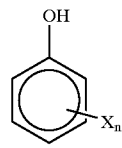

in which each X is a substituent which does not interfere with the condensation reaction with the dicarbonyl and n is an integer from 0 to 4.

6. The process of claim 1 wherein the ratio of moles of phenolic compound to moles of dicarbonyl is from about 1.5:1 to about 50:1.

7. The process of claim 1 wherein the catalyst is added at a ratio of equivalents of acid to moles of phenolic compound from 0.001 to 0.50.

8. The process of claim 1 wherein the reaction temperature ranges from 60° C. to 190° C.

9. The process of claim 1 wherein the 1,2-dicarbonyl compounds are represented by the formula:

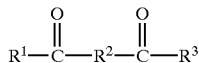

in which $R^1$ and $R^3$ are the same or different and are selected from the group consisting of hydrogen and unsubstituted and non-interfering substituted $C_1$–$C_{20}$ alkyl, $C_6$–$C_{20}$ aryl, $C_2$–$C_{12}$ alkenyl, $C_3$–$C_{10}$ cycloalkyl, $C_6$–$C_{20}$ aralkyl, and $C_6$–$C_{20}$ alkaryl and $R^2$ is a direct bond, unsubstituted and non-interfering $C_1$–$C_{10}$ alkylidene, or one to five vinylene units.

10. The process of claim 9 wherein $R^1$ and $R^3$ are the same or different and are selected from the group consisting of hydrogen, $C_1$–$C_{10}$ alkyl, $C_6$–$C_{10}$ aryl and $C_3$–$C_6$ cycloalkyl and $R^2$ is selected from the group consisting of a direct bond and $C_1$–$C_{10}$ alkyl.

11. A phenol-dicarbonyl condensate comprising the reaction product of one or more phenolic compound with one or more 1,2-dicarbonyl compounds in the presence of one or more carboxylic acid(s) or one or more carboxylic acid precursor(s) comprising maleic acid, fumaric acid, dihydroxyfumaric acid, acetylenedicarboxylic acid, 2,6-dihydroxybenzoic acid, salicylic acid, maleic anhydride, citraconic anhydride or chloromaleic anhydride.

12. The phenol-dicarbonyl condensate of claim 11 wherein the carboxylic acids are selected from the group consisting of maleic, fumaric, dihydroxyfumaric, acetylenedicarboxylic, 2,6-dihydroxybenzoic and salicylic acids.

13. The phenol-dicarbonyl condensate of claim 11 wherein the carboxylic acid precursors are selected from the group consisting of maleic anhydride, citraconic anhydride and chloromaleic anhydride.

14. The phenol-dicarbonyl condensate of claim 11 wherein the catalyst is selected from the group consisting of maleic acid and maleic anhydride.

15. The phenol-dicarbonyl condensate of claim 11 wherein the 1,2-dicarbonyl compounds are represented by the formula:

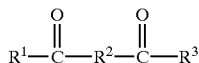

in which $R^1$ and $R^3$ are the same or different and are selected from the group consisting of hydrogen and unsubstituted and non-interfering substituted $C_1$–$C_{20}$ alkyl, $C_6$–$C_{20}$ aryl, $C_2$–$C_{12}$ alkenyl, $C_3$–$C_{10}$ cycloalkyl, $C_6$–$C_{20}$ aralkyl, and $C_6$–$C_{20}$ alkaryl and $R^2$ is a direct bond, unsubstituted and non-interfering $C_1$–$C_{10}$ alkylidene, or one to five vinylene units.

16. The phenol-dicarbonyl condensate of claim 11 wherein the phenolic compounds are represented by the formula:

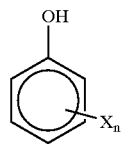

in which each X is a substituent which does not interfere with the condensation reaction with the dicarbonyl and n is an integer from 0 to 4.

17. A curable epoxy resin system comprising one or more epoxy resins and a curing agent comprising the phenol-dicarbonyl condensate of claim 11.

18. A curable laminating composition comprising one or more epoxy resins, and a curing agent comprising the phenol-dicarbonyl condensate of claim 11.

19. A laminate comprising one or more substrates and the curable laminating composition of claim 18.

20. An epoxy resin composition comprising the reaction product of epihalohydrin and the phenolic-dicarbonyl condensate of claim 11 in the presence of a strong base.

21. The epoxy resin composition of claim 20 wherein the epihalohydrin is epichlorohydrin and the strong base is sodium hydroxide.

22. A curable epoxy resin system comprising the epoxy resin composition of claim 20 and a curing agent.

23. The curable epoxy resin system of claim 22 wherein the curing agent is selected from the group consisting of dicyandiamide and phenolic curing agents.

24. A curable laminating composition comprising the epoxy resin composition of claim 20 and a curing agent.

25. The curable laminating composition of claim 24 wherein the curing agent is selected from the group consisting of dicyandiamide and phenolic curing agents.

26. A laminate comprising one or more substrates and the curable laminating composition of claim 24.

* * * * *